(12) United States Patent
Hirose et al.

(10) Patent No.: US 9,337,361 B2
(45) Date of Patent: May 10, 2016

(54) PHOTOELECTRIC CONVERSION DEVICE AND MANUFACTURING METHOD THEREOF

(75) Inventors: Takashi Hirose, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1016 days.

(21) Appl. No.: 13/299,768

(22) Filed: Nov. 18, 2011

(65) Prior Publication Data

US 2012/0132271 A1    May 31, 2012

(30) Foreign Application Priority Data

Nov. 26, 2010 (JP) ................................. 2010-263337

(51) Int. Cl.
| | |
|---|---|
| *H01L 31/00* | (2006.01) |
| *H01L 31/0224* | (2006.01) |
| *H01L 31/0747* | (2012.01) |
| *H01L 31/18* | (2006.01) |

(52) U.S. Cl.
CPC ...... *H01L 31/022425* (2013.01); *H01L 31/022433* (2013.01); *H01L 31/0747* (2013.01); *H01L 31/1804* (2013.01); *Y02E 10/547* (2013.01); *Y02P 70/521* (2015.11)

(58) Field of Classification Search
CPC ............ H01L 31/022433; H01L 31/0236; H01L 31/02363
See application file for complete search history.

(56) References Cited

U.S. PATENT DOCUMENTS

| | | | |
|---|---|---|---|
| 5,681,402 A * | 10/1997 | Ichinose et al. ............... | 136/256 |
| 7,708,910 B2 | 5/2010 | Abe et al. | |
| 2005/0150543 A1* | 7/2005 | Nakashima et al. .......... | 136/256 |
| 2005/0189013 A1* | 9/2005 | Hartley ......................... | 136/256 |
| 2006/0065298 A1* | 3/2006 | Nakashima et al. .......... | 136/256 |
| 2006/0196535 A1* | 9/2006 | Swanson et al. .............. | 136/244 |
| 2007/0017567 A1* | 1/2007 | Gronet et al. ................. | 136/246 |
| 2010/0024871 A1* | 2/2010 | Oh et al. ....................... | 136/256 |
| 2010/0154874 A1 | 6/2010 | Hirose et al. | |
| 2011/0000545 A1 | 1/2011 | Nishi et al. | |

(Continued)

FOREIGN PATENT DOCUMENTS

| | | |
|---|---|---|
| EP | 1329488 A | 7/2003 |
| EP | 2375454 A | 10/2011 |
| JP | 2000-188414 A | 7/2000 |

(Continued)

OTHER PUBLICATIONS

N B Mason et al; "A High Efficiency Silicon Solar Cell Production Technology"; Proceedings of the 10th European Photovoltaic Solar Energy Conference; 1991; pp. 280-283.

*Primary Examiner* — Eli Mekhlin
(74) *Attorney, Agent, or Firm* — Fish & Richardson P.C.

(57) ABSTRACT

In a method for manufacturing a photoelectric conversion device, a method for forming an embedded electrode is provided, which is suitable for a groove with a high aspect ratio. A first groove and a second groove intersecting with the first groove are formed in a crystalline silicon substrate, an i-type first silicon semiconductor layer, a second silicon semiconductor layer with one conductivity type, and a light-transmitting conductive film are sequentially formed on the surface of the crystalline silicon substrate and on the grooves, a conductive resin is injected into the first groove, and the second groove is filled with the conductive resin by a capillary action to form a grid electrode.

8 Claims, 7 Drawing Sheets

(56) References Cited

U.S. PATENT DOCUMENTS

2011/0284050 A1    11/2011  Saita et al.
2012/0305072 A1 *  12/2012  Fujimori .......... H01L 31/022441
                                                           136/256

FOREIGN PATENT DOCUMENTS

| | | |
|---|---|---|
| JP | 2002-121437 A | 4/2002 |
| JP | 2003-031831 A | 1/2003 |
| JP | 2004-281813 A | 10/2004 |
| JP | 2006-54374 A | 2/2006 |
| JP | 2006-286822 A | 10/2006 |
| JP | 2009-021330 A | 1/2009 |
| JP | 2009-295715 A | 12/2009 |
| JP | 2010-027778 A | 2/2010 |
| JP | 2010-147194 A | 7/2010 |
| WO | WO 2011074467 A1 * 6/2011 ...... H01L 31/022441 |

* cited by examiner

PHOTOELECTRIC CONVERSION DEVICE AND MANUFACTURING METHOD THEREOF

BACKGROUND OF THE INVENTION

1. Field of the Invention

The present invention relates to a photoelectric conversion device in which a crystalline silicon substrate is used, and a method for manufacturing the photoelectric conversion device.

2. Description of the Related Art

In recent years, photoelectric conversion devices that generate power without carbon dioxide emissions have been attracting attention as a countermeasure against global warming. As typical examples thereof, solar cells have been known which use crystalline silicon substrates such as single crystalline and polycrystalline silicon substrates.

In general, the solar cells have a light-receiving surface provided, as an electrode for collecting an electric current, with a grid electrode formed from a metal film, a conductive resin film, or the like. While the grid electrode has the effect of preventing the power loss due to a series resistance, the region behind the grid electrode serves as a region which makes no contribution to electric power generation, and it has been thus desired that the grid electrode will be reduced in width to decrease the area of the grid electrode.

In the case of reducing the width of the grid electrode, in order to prevent the resistance from being increased, the grid electrode is preferably formed so as to have a high aspect ratio in cross section in a short axis direction. As one of means for forming this type of grid electrode, the formation of an embedded electrode has been attempted (see Patent Document 1 and Non-Patent Document 1).

Patent Document 1 provides a method in which a crystalline silicon substrate is subjected to dicing processing to form a groove, and the groove is filled with a conductive resin by a screen printing method under reduced pressure. In addition, Non-Patent Document 1 provides a method in which a crystalline silicon substrate is subjected to laser processing to form a groove, and the groove is filled with a conductive layer by an electroless plating method.

[Patent Document 1] Japanese Published Patent Application No. 2006-54374

[Non-Patent Document 1] N. B. Mason, D. Jordan, J. G. Summers, Proceedings of the 10th European Photovoltaic Solar Energy Conference (1991) 280.

SUMMARY OF THE INVENTION

The screen printing under reduced pressure not only complicates the device configuration and process thereof, but also quickly dries the conductive resin attached to a printing plate, and thus has problems such as making clogging likely to be caused, with poor productivity. In addition, the electroless plating method has concern about heterogeneity of pretreatment and the semiconductor substrate contaminated from a plating solution, etc.

In addition, for the reason that the groove for forming the embedded electrode is desirably formed in a narrower and deeper shape, that is, a shape with a higher aspect ratio, the methods described above are not able to be considered appropriate. For example, in the screen printing, a printing plate has to be used which has a pattern formed with a line width smaller than the width of the groove, and a high degree of alignment accuracy is thus required. In addition, the conductive resin with which the printing plate is filled is not able to be extracted from the printing plate unless the conductive resin is brought into contact with the surface to be subjected to printing, and not able to be dropped directly into the space of the groove. Accordingly, it is necessary to bring the printing resin into contact with the periphery of the groove, and a grid electrode will be thus formed which has a substantially larger line width than the width of the groove. Furthermore, the electroless plating method is a liquid-phase process, and thus likely to be affected by air bubbles remaining in the groove, and to cause defectives in the process, such as disconnection. In any of the methods, the difficulty level of the process is increased as the aspect ratio of the groove is increased in a cross-sectional shape in the short axis direction.

Therefore, an object of an aspect of the present invention is to provide, in a method for manufacturing a photoelectric conversion device, a method for forming an embedded electrode, which is suitable for a groove with a high aspect ratio in cross-sectional shape in the short axis direction. In addition, another object thereof is to provide a photoelectric conversion device including the embedded electrode.

An aspect of the present invention disclosed in this specification relates to a method for manufacturing a photoelectric conversion device, in which a groove is formed in a crystalline silicon substrate, and a conductive resin is injected into the groove with the use of a capillary action to form an embedded grid electrode, and relates to a photoelectric conversion device including the embedded grid electrode.

An aspect of the present invention disclosed in this specification is a method for manufacturing a photoelectric conversion device, which comprises the steps of: forming a first groove and a second groove intersecting with the first groove on one side of a crystalline silicon substrate; forming a first silicon semiconductor layer on the first groove and the second groove, as well as on the one side of the crystalline silicon substrate; forming a second silicon semiconductor layer having one conductivity type on the first silicon semiconductor layer; forming a third silicon semiconductor layer on the other side of the crystalline silicon substrate; forming, on the third silicon semiconductor layer, a fourth silicon semiconductor layer having the conductivity type opposite to the one conductivity type; forming a light-transmitting conductive film on the second silicon semiconductor layer; forming a rear electrode on the fourth silicon semiconductor layer; and injecting a conductive resin into the first groove and the second groove on which the first silicon semiconductor layer, the second silicon semiconductor layer, and the light-transmitting conductive film are stacked, and baking the conductive resin, thereby forming an embedded grid electrode, wherein the conductive resin is injected into the second groove in such a way that the conductive resin is injected into the first groove, and injected from the first groove into the second groove with the use of a capillary action.

It is to be noted that the ordinal numbers such as "first" and "second" in this specification, etc. are assigned in order to avoid confusion among components, but not intended to limit the number or order of the components.

Another aspect of the present invention disclosed in this specification is a method for manufacturing a photoelectric conversion device, which comprises the steps of: forming a first groove and a second groove intersecting with the first groove on one side of a crystalline silicon substrate; forming a first silicon semiconductor layer on the first groove and the second groove, as well as on the one side of the crystalline silicon substrate; forming a second silicon semiconductor layer having one conductivity type on the first silicon semiconductor layer; forming a third silicon semiconductor layer on the other side of the crystalline silicon substrate; forming, on the third silicon semiconductor layer, a fourth silicon semiconductor layer having the conductivity type opposite to the one conductivity type; forming a rear electrode on the fourth silicon semiconductor layer; injecting a conductive resin into the first groove and the second groove on which the first silicon semiconductor layer and the second silicon semiconductor layer are stacked, and baking the conductive resin, thereby forming an embedded grid electrode; and forming a light-transmitting conductive film on the second silicon semiconductor layer and the grid electrode, wherein the conductive resin is injected into the second groove in such a way that the conductive resin is injected into the first groove, and injected from the first groove into the second groove with the use of a capillary action.

The second groove is preferably formed to be smaller in width than the first groove, and the photoelectric conversion device is configured in such a way that the conductive resin injected into the first groove is likely to be injected by a capillary action into the second groove.

The conductive resin preferably has a viscosity of 100 mPa·s or less. The lower viscosity makes it possible to carry out the injection of the conductive resin into the groove easily.

In addition, the conductive resin may be, more than once, injected into the first groove and the second groove and subjected to baking.

Another aspect of the present invention disclosed in this specification is a photoelectric conversion device comprising: a first groove provided on one side of a crystalline silicon substrate; a second groove intersecting with the first groove; a first silicon semiconductor layer provided on the first groove and the second groove, as well as on the one side of the crystalline silicon substrate; a second silicon semiconductor layer provided on the first silicon semiconductor layer, the second silicon semiconductor layer having one conductivity type; a third silicon semiconductor layer provided on the other side of the crystalline silicon substrate; a fourth silicon semiconductor layer provided on the third silicon semiconductor layer, the fourth silicon semiconductor layer having the conductivity type opposite to the one conductivity type; a light-transmitting conductive film provided on the second silicon semiconductor layer; a rear electrode provided on the fourth silicon semiconductor layer; and an embedded grid electrode comprising a conductive resin, the grid electrode in contact with the light-transmitting conductive film, and the grid electrode formed on the first groove and the second groove.

In addition, another aspect of the present invention disclosed in this specification is a photoelectric conversion device comprising: a first groove provided on one side of a crystalline silicon substrate; a second groove intersecting with the first groove; a first silicon semiconductor layer provided on the first groove and the second groove, as well as on the one side of the crystalline silicon substrate; a second silicon semiconductor layer provided on the first silicon semiconductor layer, the second silicon semiconductor layer having one conductivity type; a third silicon semiconductor layer provided on the other side of the crystalline silicon substrate; a fourth silicon semiconductor layer provided on the third silicon semiconductor layer, the fourth silicon semiconductor layer having the conductivity type opposite to the one conductivity type; a rear electrode provided on the fourth silicon semiconductor layer; an embedded grid electrode comprising a conductive resin, the grid electrode in contact with the second silicon semiconductor layer, and the grid electrode formed on the first groove and the second groove; and a light-transmitting conductive film provided on the second silicon semiconductor layer and the grid electrode.

The second groove is configured to be smaller in width than the first groove. The grid electrode formed in the first groove is used as a bus bar electrode, whereas the grid electrode formed in the second groove is used as a finger electrode.

In addition, a metal wire may be embedded in the first groove and the second groove, or in either one of the grooves. The metal wire embedded can further lower the resistance of the grid electrode.

The use of one aspect of the present invention can form an embedded electrode which has a high aspect ratio in cross-section in the short axis direction, and thus provide a photoelectric conversion device which has improved electrical characteristics.

DETAILED DESCRIPTION OF THE INVENTION

Hereinafter, embodiments of the present invention will be described in detail with reference to the accompanying drawings. However, the present invention is not limited to the following description, and it is easily understood by those skilled in the art that modes and details disclosed herein can be modified in various ways without departing from the spirit and scope of the present invention. In addition, the present invention is not to be construed as being limited to the following descriptions of the embodiments. It is to be noted that in all of the drawings for explaining the embodiments, like sections or sections having a similar function are denoted by the same reference numerals, and the description thereof may be omitted in some cases.

Figure 1:
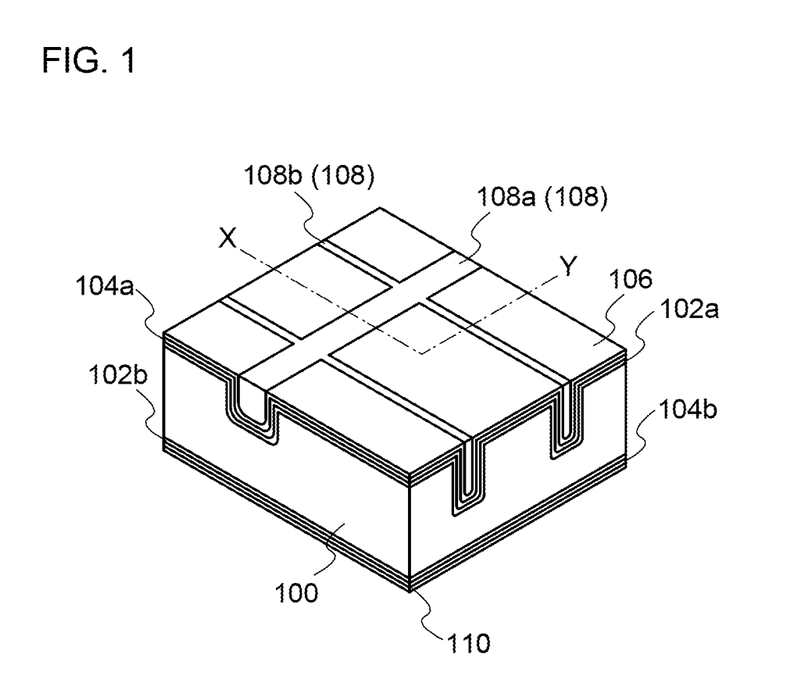
FIG. 1 is a perspective view illustrating a photoelectric conversion device according to one aspect of the present invention.

FIG. 1 shows an example of a perspective view of a photoelectric conversion device according to one aspect of the present invention. It is to be noted that FIG. 1 is a diagram of a clipped portion of the photoelectric conversion device for the sake of clearly explaining the cross-section structure.

The photoelectric conversion device shown in FIG. 1 is configured to include a first silicon semiconductor layer 102a and a third silicon semiconductor layer 102b in contact with a crystalline silicon substrate 100, a second silicon semiconductor layer 104a and a fourth silicon semiconductor layer 104b in contact with the first silicon semiconductor layer 102a and the third silicon semiconductor layer 102b, a light-transmitting conductive film 106 in contact with the second silicon semiconductor layer 104a, a grid electrode 108 in contact with the light-transmitting conductive film 106, and a rear electrode 110 in contact with the fourth silicon semiconductor layer 104b. It is to be noted that side with the grid electrode 108 formed serves as a light-receiving surface.

The first silicon semiconductor layer 102a and the third silicon semiconductor layer 102b are high-quality i-type semiconductor layers containing hydrogen with few defects, which can terminate surface defects of the crystalline silicon substrate 100, and thus reduce the recombination of minority carriers in the photoelectric conversion layer, thereby making the lifetime of the minority carriers longer.

It is to be noted that in this specification, the term "i-type semiconductor" refers not only to a so-called intrinsic semiconductor with the Fermi level positioned in the middle of the band gap, but also to a semiconductor in which the concentration of an impurity for imparting p-type or n-type conductivity is $1 \times 10^{20}$ atoms/cm$^3$ or less, and in which the photoconductivity is higher than the dark conductivity. For example, amorphous silicon semiconductors formed by a plasma CVD method or the like can be used for the first silicon semiconductor layer 102a and the third silicon semiconductor layer 102b.

It is to be noted that the photoelectric conversion layer in this specification is intended to mean a semiconductor region which makes a significant contribution to photoelectric conversion. In the present embodiment, the crystalline silicon substrate 100 and the first silicon semiconductor layer 102a and third silicon semiconductor layer 102b in contact with the crystalline silicon correspond to the photoelectric conversion layer.

The second silicon semiconductor layer 104a and fourth silicon semiconductor layer 104b refer to internal electric field forming layers, and one of the second silicon semiconductor layer 104a and fourth silicon semiconductor layer 104b is formed from a p-type semiconductor layer, whereas the other is formed from an n-type semiconductor layer. The semiconductor layers can be formed from, for example, an amorphous silicon layer or a microcrystalline silicon layer containing an impurity for imparting a conductivity type.

The crystalline silicon substrate 100 has grooves formed so as to intersect with each other, and the grooves have therein the first silicon semiconductor layer 102a, second silicon semiconductor layer 104a, light-transmitting conductive film 106, and grid electrode 108 embedded. It is to be noted that a region of the grid electrode 108 which is larger in line width corresponds to a bus bar electrode 108a, whereas the other region thereof which is smaller in line width corresponds to a finger electrode 108b.

The embedded grid electrode 108 can form a high-aspect ratio electrode, and thus suppress an increase in resistance with miniaturization of the grid electrode 108. More specifically, the light-receiving area can be increased without involving any adverse effect (increase in resistance) with miniaturization of the grid electrode 108, and the conversion efficiency of the photoelectric conversion device can be thus improved.

Figure 2:
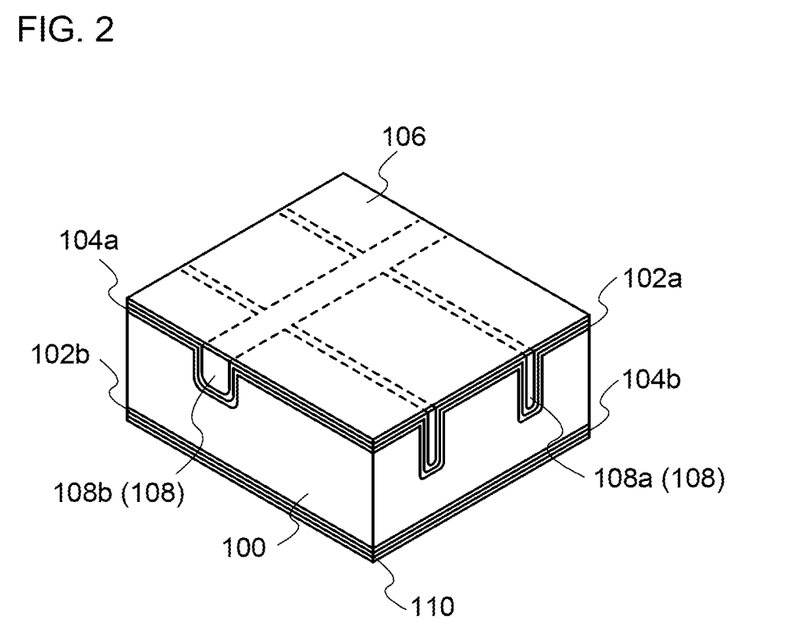
FIG. 2 is a perspective view illustrating a photoelectric conversion device according to one aspect of the present invention.

It is to be noted that the photoelectric conversion device according to one aspect of the present invention is not limited to the structure in FIG. 1, and may have a structure shown in FIG. 2. The photoelectric conversion device in FIG. 2 is different from the structure in FIG. 1 in stacking order of the grid electrode 108 and the light-transmitting conductive film 106, which has the light-transmitting conductive film 106 over the entire surface of the light-receiving surface side. This structure is effective when the coverage of the wall surface of the grooves with the light-transmitting conductive film is not sufficient in the structure in FIG. 1, and makes it possible to provide a favorable condition of contact between the grid electrode 108 and the light-transmitting conductive film 106.

A method for manufacturing the photoelectric conversion device shown in FIG. 1 will be described below with reference to FIGS. 3A to 3C. It is to be noted that FIGS. 3A to 3C are cross-sectional views corresponding to the cross section along the line X-Y shown in FIG. 1.

For the crystalline silicon substrate which can be used in one aspect of the present invention, a single crystalline silicon substrate and a polycrystalline silicon substrate can be used. The conductivity types or manufacturing methods for these crystalline silicon substrates are not particularly limited. In the present embodiment, an n-type single crystalline silicon substrate is used which is produced by a MCZ (Magnetic Czochralski) method.

Figure 3A:
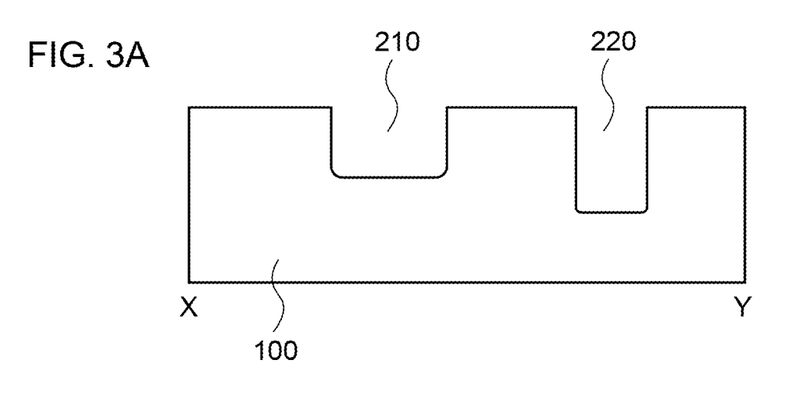
FIGS. 3A to 3C are cross-sectional views illustrating a method for manufacturing a photoelectric conversion device according to one aspect of the present invention.
Figure 3B:
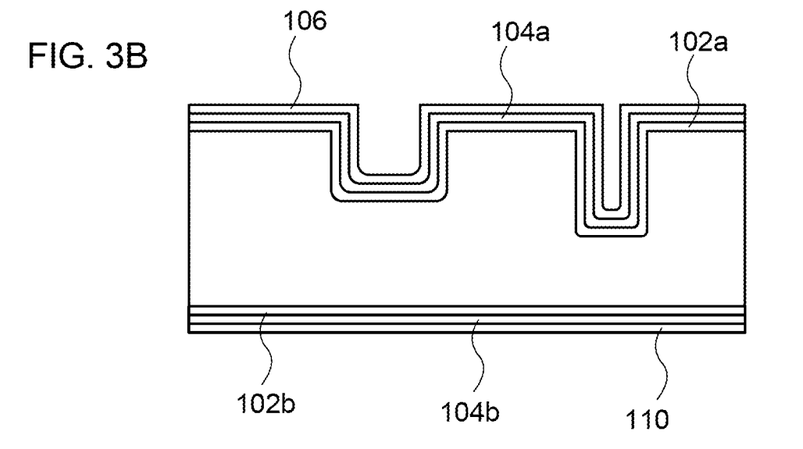
Figure 3C:
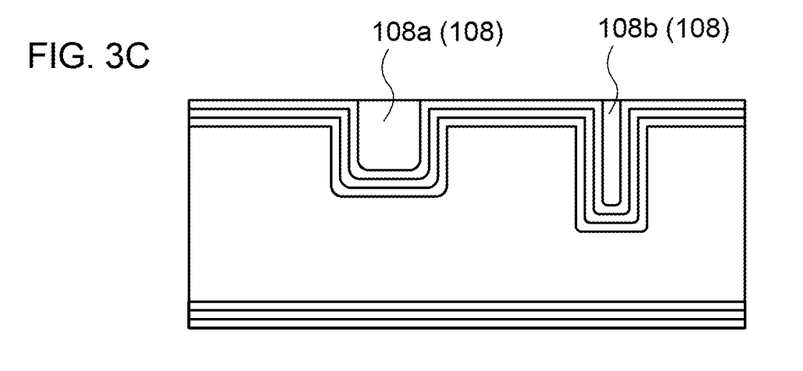

First, a first groove 210 and a second groove 220 are formed in a crystalline silicon substrate 100 (see FIG. 3A). The grooves can be formed by dicing processing or laser processing. The grooves in FIG. 3A have the shapes (rectangular shapes) shown when dicing processing is used, but may be V-shaped grooves. When laser processing is carried out, the grooves are likely to be V-shaped grooves. In addition, the use of a dicing blade with a periphery processed in a V-shape makes it possible to provide the grooves with V-shaped bottoms even in the case of dicing processing.

Further, in the case of carrying out laser processing, the fundamental wave (wavelength: 1064 nm), second harmonic wave (wavelength: 532 nm), third harmonic wave (wavelength: 355 nm), fourth harmonic wave (wavelength: 266 nm), or the like of a YAG laser can be used to adjust the beam diameter, output, and scan speed, and thereby form grooves in desired shapes. For example, when the third harmonic wave of a YAG laser is used to process a single crystalline silicon substrate at a beam diameter $\phi$ of 20 µm, a power density of 160 kW/cm$^2$, and a scan speed of 0.1 cm/sec, a groove can be formed which is 30 µm to 40 µm in width and 40 µm to 70 µm in depth.

The first groove 210 is a groove for embedding the bus bar electrode, which is to be 0.1 mm or more and 2.0 mm or less, preferably 0.25 mm or more and 1.5 mm or less, more preferably 0.5 mm or more and 1.0 mm or less in width. The groove is formed to have a width not only in consideration of the resistance required as the bus bar electrode, but also so as not to make it difficult to carry out a step of injecting a conductive resin as will be described later.

The second groove 220 is a groove for embedding the finger electrode, which is to be 0.01 mm or more and 0.1 mm or less, preferably 0.01 mm or more and 0.08 mm or less, more preferably 0.01 mm or more and 0.06 mm or less in width. The groove is formed to have a width not only in consideration of the resistance required as the finger electrode, but also so as to develop a sufficient capillary action required for the injection of a conductive resin as will be described later.

It is to be noted that while FIG. 3A shows a structure in which the first groove 210 is formed shallowly, whereas the second groove 220 is formed deeply, the present invention is not limited to this structure, and may have a structure in which the first groove 210 is formed more deeply, or a structure in which the grooves are formed to have the same depth. However, in view of the strength of the substrate, the depth of the groove preferably have an upper limit of ⅔, preferably ½ of the substrate thickness. The excessively deep groove may make it impossible to maintain the strength of the substrate to cause a breakage failure during the process, or decrease the strength of a product to degrade the reliability in some cases. For example, when the substrate is 0.5 mm in thickness, the depth of the groove preferably has an upper limit from approximately 0.25 mm to approximately 0.35 mm.

Then, damaged layers produced in the surface layers of the first groove 210 and second groove 220 are removed in an etching step. For the etching, an etching solution can be used which contains an acetic acid, a hydrofluoric acid, and a nitric acid, for example. The etching solution can etch the damaged layers preferentially through the adjustment of the proportions of the respective acids. In addition, an alkaline etching solution may be used to etch the surface of the crystalline silicon substrate 100, and form a texture at the same time. The formation of the texture can provide the photoelectric conversion device with an antireflection effect or an optical confinement effect. It is to be noted that this etching step can be skipped.

Then, a plasma CVD method is used to form the first silicon semiconductor layer 102a on the side of the crystalline silicon substrate 100 with the grooves formed. The first silicon semiconductor layer 102a preferably has a thickness of 3 nm or more and 50 nm or less. In the present embodiment, the first silicon semiconductor layer 102a is an i-type amorphous silicon, which has a film thickness of 5 nm.

For example, the conditions for depositing the first silicon semiconductor layer 102a may be a monosilane gas introduced into a reaction chamber at a flow rate of 5 sccm or more and 200 sccm or less, a pressure of 10 Pa or more and 100 Pa or less in the reaction chamber, an electrode interval of 15 mm or more and 40 mm or less, and a power density of 8 mW/cm$^2$ or more and 50 mW/cm$^2$ or less.

Then, the second silicon semiconductor layer 104a is formed on the first silicon semiconductor layer 102a. The second silicon semiconductor layer 104a preferably has a thickness of 3 nm or more and 50 nm or less. In the present embodiment, the second silicon semiconductor layer 104a is p-type microcrystalline silicon, which has a film thickness of 10 nm. It is to be noted that p-type amorphous silicon may be used for the second silicon semiconductor layer 104a.

For example, the conditions for depositing the second silicon semiconductor layer 104a may be a monosilane gas, hydrogen and a hydrogen-based diborane (0.1%) introduced into a reaction chamber respectively at a flow rate of 1 sccm or more and 10 sccm or less, a flow rate of 100 sccm or more and 5000 sccm or less, and a flow rate of 5 sccm or more and 50 sccm or less, a pressure of 450 Pa or more and 100000 Pa or less, preferably 2000 Pa or more and 50000 Pa or less in the reaction chamber, an electrode interval of 8 mm or more and 30 mm or less, and a power density of 200 mW/cm$^2$ or more and 1500 mW/cm$^2$ or less.

Then, a plasma CVD method is used to form the third silicon semiconductor layer 102b on the other side of the crystalline silicon substrate 100. The third silicon semiconductor layer 102b preferably has a thickness of 3 nm or more and 50 nm or less, and in the present embodiment, the third silicon semiconductor layer 102b is i-type, and has a film thickness of 5 nm. It is to be noted that the third silicon semiconductor layer 102b can be formed under the same deposition conditions as in the case of the first silicon semiconductor layer 102a.

Then, the fourth silicon semiconductor layer 104b is formed on the third silicon semiconductor layer 102b. The fourth silicon semiconductor layer 104b preferably has a thickness of 3 nm or more and 50 nm or less. In the present embodiment, the fourth silicon semiconductor layer 104b is n-type microcrystalline silicon, which has a film thickness of 10 nm. It is to be noted that n-type amorphous silicon may be used for the fourth silicon semiconductor layer 104b.

For example, the conditions for depositing the fourth silicon semiconductor layer 104b may be a monosilane gas, hydrogen and a hydrogen-based phosphine (0.5%) introduced into a reaction chamber respectively at a flow rate of 1 sccm or more and 10 sccm or less, a flow rate of 100 sccm or more and 5000 sccm or less, and a flow rate of 5 sccm or more and 50 sccm or less, a pressure of 450 Pa or more and 100000 Pa or less, preferably 2000 Pa or more and 50000 Pa or less in the reaction chamber, an electrode interval of 8 mm or more and 30 mm or less, and a power density of 200 mW/cm$^2$ or more and 1500 mW/cm$^2$ or less.

It is to be noted that in the present embodiment, while an RF power source which has a frequency of 13.56 MHz is used for the power source for use in the deposition of the amorphous silicon layers and microcrystalline silicon layers described above, an RF power source of 27.12 MHz, 60 MHz, or 100 MHz may be used. In addition, the deposition may be carried out by not only continuous discharge but also pulse discharge. The implementation of pulse discharge can improve the film quality and reduce particles produced in the gas phase.

Then, the light-transmitting conductive film 106 is formed on the second silicon semiconductor layer 104a. For the light-transmitting conductive film 106, for example, an indium tin oxide, an indium tin oxide containing silicon, an indium oxide containing zinc, a zinc oxide, a zinc oxide containing gallium, a zinc oxide containing aluminum, a tin oxide, a tin oxide containing fluorine, or a tin oxide containing antimony, etc. can be used. In addition, the light-transmitting conductive film 106 is not limited to a single layer, and may be a stacked layer of different films. For example, a stacked layer of an indium tin oxide and a zinc oxide containing aluminum, a stacked layer of an indium tin oxide and a tin oxide containing fluorine, etc. can be used. The film thickness is to be 10 nm or more and 1000 nm or less in total. In addition, the surface of the light-transmitting conductive film 106 may have a texture structure.

Then, the rear electrode 110 is formed on the fourth silicon semiconductor layer 104b (see FIG. 3B). Low-resistance metals such as silver, aluminum, and copper can be used for the rear electrode 110, which can be formed by a sputtering method, a vacuum evaporation method, or the like. Alternatively, a screen printing method may be used to form the rear electrode 110 from a conductive resin such as a silver paste or a copper paste.

It is to be noted that the formation of the films provided on the front and back of the crystalline silicon substrate 100 is not limited to the order indicated above, as long as the structure shown in FIG. 3B may be formed. For example, the first silicon semiconductor layer 102a may be formed, and the third silicon semiconductor layer 102b may be then formed.

Then, a conductive resin is injected so as to come into contact with the light-transmitting conductive film 106 in the first groove 210 and the second groove 220, thereby forming the grid electrode 108 (see FIG. 3C). A method for forming the grid electrode 108 will be described in detail with reference to FIG. 4.

Figure 4:
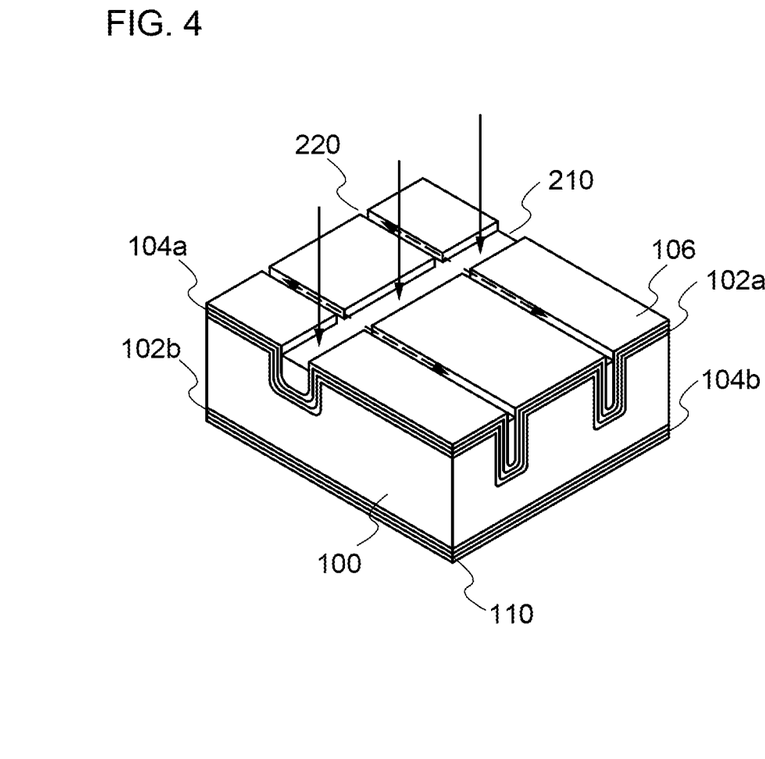
FIG. 4 is a perspective view illustrating a method for manufacturing a photoelectric conversion device according to one aspect of the present invention.

FIG. 4 shows a conductive resin which is injected into the first groove 210 to serve as a bus bar electrode and the second groove 220 to serve as a finger electrode. First, an appropriate amount of conductive resin is injected into the first groove 210 (solid arrows in the figure). A dispensing method is used for the injection of the conductive resin. Alternatively, an ink-jet method may be used.

Since the first groove 210 and the second groove 220 are connected in a crossing, the conductive resin injected into the first groove 210 flows in the direction indicated by dotted arrows in the figure to be injected into the second groove 220. In this case, the second groove is formed to have a width of 0.01 mm or more and 0.1 mm or less, and a capillary action is thus developed to make it possible to inject the conductive resin into the second groove easily.

The injection of the conductive resin into the groove in accordance with this method is carried out so as to fill the groove in the horizontal direction from one end of the groove, and the groove can be thus filled densely with the conductive resin, without leaving air bubbles inside the groove. It is to be noted that the injection of the conductive resin into the groove and the baking thereof may be repeated more than once, because the conductive resin may undergo a change in volume after baking. In addition, ultrasonic vibrations may be applied to the crystalline silicon substrate 100 to promote the injection of the conductive resin into the groove.

For the conductive resin, conductive resins can be used which include silver, gold, silver-palladium, copper, or the like as a filler, and conductive resins are preferable which have a low resistance, and include relatively low-cost silver as a filler. In addition, the use of so-called nanoparticles with a filler size of 5 nm to 100 nm is particularly preferable for the filler. Aqueous solvents, hydrocarbon-based solvents, ketone-based solvents, etc. can be used as a solvent for the conductive resin. In addition, the viscosity of the conductive resin is to be 100 mPa·s or less, preferably 10 mPa·s, and more preferably 1 mPa·s. The lower viscosity makes it possible to carry out the injection into the groove easily. In addition, the conductive resin is preferably a thermosetting resin which can be baked at low temperatures, so as not to alter the film quality of the first silicon semiconductor layer 102a and third silicon semiconductor layer 102b. For example, a conductive resin is used which can be baked at 300° C. or less, preferably 250° C. or less.

Figure 5:
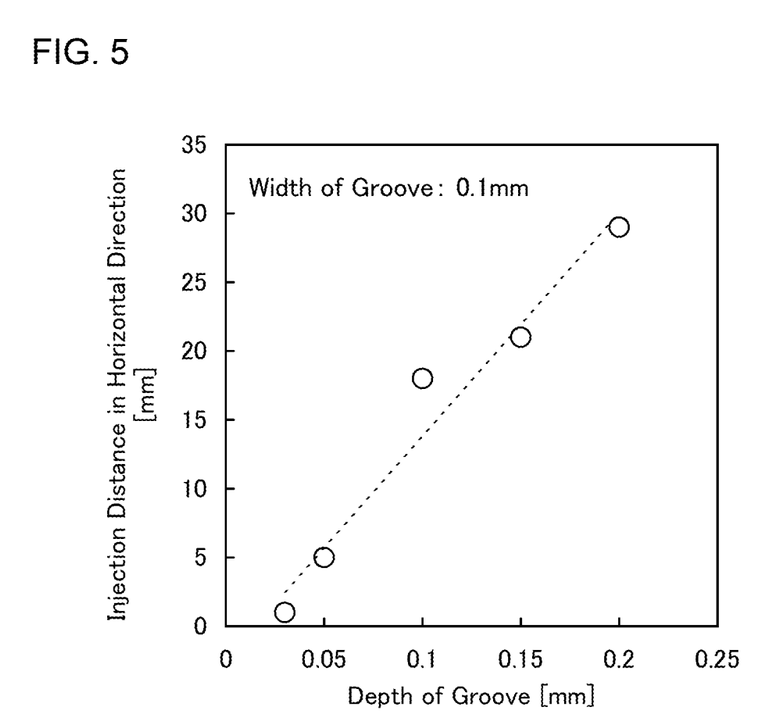
FIG. 5 is a graph showing the relationship between the depth of a groove and the injection distance of a conductive resin in a horizontal direction.

It is to be noted that the horizontal distance over which the conductive resin is injected by the capillary action into the groove varies depending on the width of the second groove 220, and the smaller the width is, the more the distance can be extended. In addition, the deeper the second groove is, the more the distance can be extended. FIG. 5 is obtained by forming a groove of 0.1 mm in width and of 0.03 mm to 0.2 mm in depth in a crystalline silicon substrate, delivering a conductive resin including silver nanoparticles (an aqueous solvent, with a viscosity of 15 mPa·s) by drops into the end of the groove, and finding out the injection distance in the horizontal direction. The deeper the groove is, the longer the injection distance is, and an injection distance of approximately 30 mm is achieved when the groove has a depth of 0.2 mm. This result indicates the possibility of adequate handling even in the case of a cell of 10 cm×10 cm or larger, as long as two bus bar electrodes are provided.

It is to be noted that when the first groove 210 and the second groove 220 are to be formed by laser processing, an inner region of the crystalline silicon substrate 100 with respect to the edge thereof can be selectively subjected to processing to form the grooves. However, in the case of dicing processing, the grooves are formed to the end of the crystalline silicon substrate 100. Accordingly, when the first groove 210 and the second groove 220 are formed by dicing processing, a structure is preferably adopted in which the leakage of the conductive resin from the end of the first groove 210 or the end of the second groove 220 is not caused in the injection of the conductive resin.

Figure 6A:
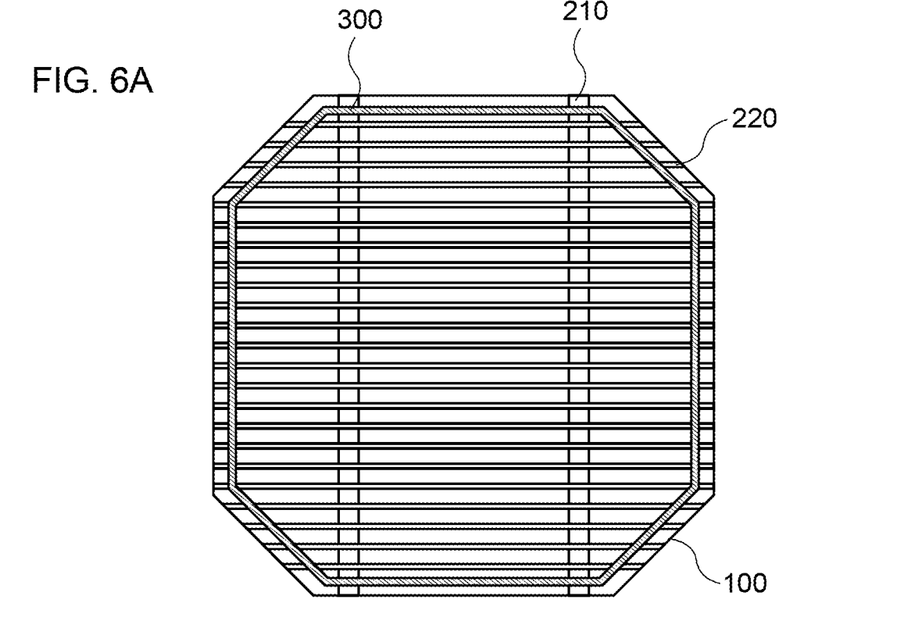
FIGS. 6A and 6B are plan views illustrating a photoelectric conversion device according to one aspect of the present invention.
Figure 6B:
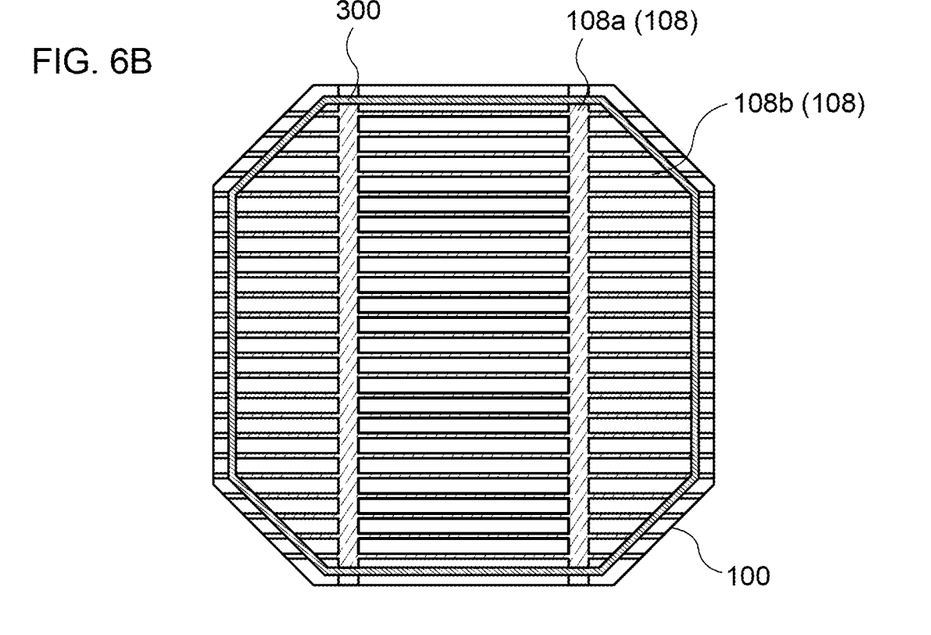

For example, as shown in FIGS. 6A and 6B, a wall section 300 is preferably provided in the vicinity of the edge of the crystalline silicon substrate 100. FIG. 6A is a plan view of the wall section 300 formed after the formation of the first groove 210 and second groove 220. The wall section 300 is formed by a dispensing method or the like in such a way that the groove in the vicinity of the edge of the crystalline silicon substrate 100 is filled with an insulating resin or a conductive resin. It is to be noted that while FIG. 6A shows the wall section 300 formed also in the region other than the grooves, the wall section 300 may be formed so as to fill only the grooves selectively. In this case, a high-viscosity resin is preferably used for the insulating resin or conductive resin for use in the formation of the wall section 300, so as not to be injected by a capillary action into the second groove 220 in the horizontal direction.

The conductive resin injected by the method described above after the formation of the wall section 300 makes it possible to achieve a structure with a grid electrode 108 formed inside the wall section 300 as shown in FIG. 6B. It is to be noted that a deeper groove than the finger electrode 108b may be provided under the wall section 300. The groove provided can separate the edge of the crystalline silicon substrate 100 which is short in carrier lifetime, and thus improve the characteristics of the photoelectric conversion layer.

Figure 7:
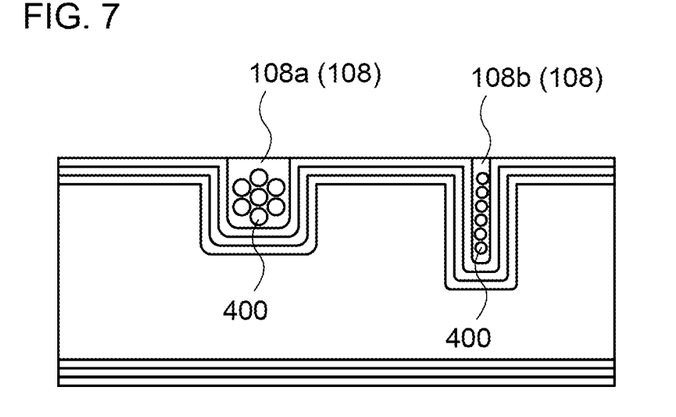
FIG. 7 is a cross-sectional view illustrating a photoelectric conversion device according to one aspect of the present invention.

In addition, as shown in FIG. 7, a structure may be adopted in which metallic wires 400 are embedded in a first groove 210 and a second groove 220 or in either one thereof. Since the conductive resin is higher in resistance than metals, the embedded electrode formed from both the metallic wires 400 and the conductive resin can form a grid electrode 108 which has a further lower resistance. In addition, the metallic wires put in the grooves can also achieve the effect of making a capillary action more likely to be produced. It is to be noted that wires formed from a low-resistance metallic material such as silver and copper are suitable for the metallic wires 400, which may be single wires or twisted wires.

As described above, an embedded electrode can be formed which has a high aspect ratio in cross-section in the short axis direction, and a photoelectric conversion device can be thus provided which has improved electrical characteristics. It is to be noted that the photoelectric conversion device in FIG. 2 can be formed by reversing the order of forming the light-transmitting conductive film and the conductive resin to serve as a grid electrode in the manufacturing method described above.

This application is based on Japanese Patent Application serial No. 2010-263337 filed with Japan Patent Office on Nov. 26, 2010, the entire contents of which are hereby incorporated by reference.

What is claimed is:

1. A photoelectric conversion device comprising:
a first groove provided over one side of a crystalline silicon substrate;
a second groove intersecting with the first groove;
a first silicon semiconductor layer over the first groove, the second groove and the one side of the crystalline silicon substrate;
a second silicon semiconductor layer over the first silicon semiconductor layer, the second silicon semiconductor layer having one conductivity type;
a third silicon semiconductor layer over another side of the crystalline silicon substrate;
a fourth silicon semiconductor layer over the third silicon semiconductor layer, the fourth silicon semiconductor layer having a conductivity type opposite to the one conductivity type;
a rear electrode over the fourth silicon semiconductor layer;
an embedded grid electrode comprising a conductive resin in the first groove and the second groove, wherein the grid electrode is in contact with the second silicon semiconductor layer, and wherein a top surface of the grid electrode is aligned with a top surface of the second silicon semiconductor layer; and a light-transmitting conductive film over the second silicon semiconductor layer and the grid electrode.

2. The photoelectric conversion device according to claim 1, wherein the second groove is formed to be smaller in width than the first groove.

3. The photoelectric conversion device according to claim 1, wherein the first and third silicon semiconductor layers have an i-type conductivity, and the second silicon semiconductor layer has a p-type or n-type conductivity.

4. The photoelectric conversion device according to claim 1, further comprising a metal wire embedded in the conductive resin.

5. A photoelectric conversion device comprising:
a first groove provided over one side of a crystalline silicon substrate;
a second groove intersecting with the first groove;
a first silicon semiconductor layer over the first groove, the second groove and the one side of the crystalline silicon substrate;
a second silicon semiconductor layer over the first silicon semiconductor layer, the second silicon semiconductor layer having one conductivity type;
an embedded grid electrode comprising a conductive resin in the first groove and the second groove, wherein the grid electrode is in contact with the second silicon semiconductor layer, and wherein a top surface of the grid electrode is aligned with a top surface of the second silicon semiconductor layer; and
a light-transmitting conductive film over the second silicon semiconductor layer and the grid electrode.

6. The photoelectric conversion device according to claim 5, wherein the second groove is formed to be smaller in width than the first groove.

7. The photoelectric conversion device according to claim 5, wherein the first silicon semiconductor layer has an i-type conductivity, and the second silicon semiconductor layer has a p-type or n-type conductivity.

8. The photoelectric conversion device according to claim 5, further comprising a metal wire embedded in the conductive resin.

* * * * *